United States Patent [19]

Moslehi

[11] Patent Number: 4,891,499

[45] Date of Patent: Jan. 2, 1990

[54] METHOD AND APPARATUS FOR REAL-TIME WAFER TEMPERATURE UNIFORMITY CONTROL AND SLIP-FREE HEATING IN LAMP HEATED SINGLE-WAFER RAPID THERMAL PROCESSING SYSTEMS

[75] Inventor: Mehrdad M. Moslehi, Dallas, Tex.

[73] Assignee: Texas Instruments Incorporated, Dallas, Tex.

[21] Appl. No.: 242,404

[22] Filed: Sep. 9, 1988

[51] Int. Cl.[4] .............................................. H05B 1/02
[52] U.S. Cl. .................................. 219/502; 219/121.6; 219/121.83
[58] Field of Search ............... 219/354, 404, 411, 502, 219/121.6, 121.74, 121.77, 121.83, 121.85, 121.62; 250/354.1, 443.1; 374/20, 127

[56] References Cited

U.S. PATENT DOCUMENTS

| | | | |
|---|---|---|---|
| 4,345,455 | 8/1982 | Hayes, Jr. ............................. | 374/20 |
| 4,535,227 | 8/1985 | Shimizu ............................... | 219/411 |
| 4,629,333 | 12/1986 | Dosoretz et al. .................... | 374/20 |
| 4,649,261 | 3/1987 | Sheets ................................. | 219/405 X |
| 4,698,486 | 10/1987 | Sheets ................................. | 219/405 X |
| 4,730,113 | 3/1988 | Edwards et al. .................... | 250/354.1 X |

OTHER PUBLICATIONS

Aaron, et al., "Calculation of Temperature Profiles in Radiantly Heated and Cooled Silicon Wafers", J. Appl. Phys. 54 (6), Jun. 1983; pp. 3632-3635.
Bentini, et al., "Defects Introduced in Silicon Wafers During Rapid Isothermal Annealing: Thermoelastic and Thermoplastic Effects", J. Appl. Phys. 56 (10), Nov. 15, 1984, pp. 2922-2929.
Blake, et al., "Slip Free Rapid Thermal Processing", Mat. Res. Soc. Symp. Proc. vol. 92, 1987, pp. 265-272.
H. A. Lord, "Thermal and Stress Analysis of Semiconductor Wafers in a Rapid Thermal Processing Oven", IEEE Transactions on Semiconductor Manufacturing vol. 1, No. 3, Aug. 1988; pp. 105-114.
Hodul, "Dynamic Temperature Control: Key to Process Uniformity in Rapid Thermal Processing" (RTP), Varian Research Center, Semiconductor Equipment Group, Report No. 117, pp. 1-9.

Primary Examiner—C. L. Albritton
Attorney, Agent, or Firm—Joseph E. Rogers; James T. Comfort; Melvin Sharp

[57] ABSTRACT

A silicon semiconductor wafer (26) is placed in a vacuum chamber (12) device side (28) facedown. Laser beams of equal power are directed at an edge point (72) and a center point (74) of the wafer (26). The laser beams are reflected from the edge point (72) and the center point (74) into first and second infrared photodetectors (40-42). A differential amplifier (44) evaluates the reflected laser beams for a power difference and signals a current source (82). Current source (82) heats a quartz ring (46) which surrounds the wafer (26). The quartz ring (46) passes the heat to the wafer (26) until the amplifier (44) no longer senses a power difference, which is indicative of an equal wafer surface temperature.

32 Claims, 2 Drawing Sheets

METHOD AND APPARATUS FOR REAL-TIME WAFER TEMPERATURE UNIFORMITY CONTROL AND SLIP-FREE HEATING IN LAMP HEATED SINGLE-WAFER RAPID THERMAL PROCESSING SYSTEMS

TECHNICAL FIELD OF THE INVENTION

This invention relates in general to semiconductor wafer processing, and in particular to a method and apparatus for real-time wafer temperature control in lamp heated, single wafer rapid thermal processing (RTP) systems.

BACKGROUND OF THE INVENTION

In a single wafer rapid thermal processing (RTP) reactor, one of the critical process parameters is the temperature of the wafer. The heat needed to drive the process in RTP is provided by a heating lamp module which consists of high-intensity lamps (usually tungsten-halogen lamps or arc lamps) and a properly designed reflector for directing radiated photons onto the wafer. The lamp reflector is designed to provide a uniform temperature distribution across the surface of the wafer. Advanced VLSI fabrication processes demand a tight control over the temperature distribution of the wafer during the process. Usually the wafer temperature gradients should be kept below $\pm 5°$ C. (preferably less than $\pm 2°$ C.) in order to drive the desired fabrication process uniformly over the entire surface of the wafer and in order to minimize any defect formation on the wafer by thermally induced stresses.

However, lateral temperature gradients are common problems in lamp-heated RTP of semiconductor materials. The wafer temperature nonuniformities are direct results of the RTP hardware and process requirements which are related to the capabilities for fast wafer heating and cooling. For fast control over temperature and efficient heating of the wafer, the thermal mass of the wafer and a holder for the wafer within the RTP must be minimized. Low thermal mass usually requires operating the system in a cold-wall mode.. Therefore, in contrast to the conventional hot-wall furnace processing where the entire volume of the furnace is heated isothermally, the RTP systems usually employ lamps to selectively heat the wafer using either the free-carrier absorption or through a direct band-to-band photon absorption mechanism. Fast wafer cooling can be easily accomplished in a cold-wall RTP reader where the process chamber walls are not heated during the high-temperature process. All other wafer heat loss mechanisms, except for radiative losses, are also avoided. Lamp heating of the wafer minimizes the thermal mass effects of the process chamber and insures a rapid real-time control over the wafer temperature. However, since the wafer does not sit on a heating chuck (which would provide uniform wafer heating through high thermal mass and high thermal conductivity), the temperature uniformity becomes sensitive to the uniformity of the optical energy absorption as well as the radiative and convective heat losses (and residual conductive heat losses, if any) of the wafer.

The wafer temperature nonuniformity usually manifests itself in the form of radial temperature gradients with most of the nonuniformity localized near the wafer edge. This kind of nonuniformity typically has a cylindrical symmetry in most practical situations because:

- the optical output of the lamps and the design of the lamp reflector surface geometry are usually such that a uniform optical flux reaches the wafer surface;
- an excess radiative loss at the edge of the wafer causes localized edge cooling; and
- the edge cooling effect usually has a cylindrical symmetry.

Thus, the wafer edge temperature can be a few degrees or a few tens of degrees (Celcius) cooler than the center during the thermal cycling process in the RTP (particularly during the constant-temperature soak or during the rapid cool-down periods of the thermal cycle).

The temperature nonuniformity may produce slip dislocation lines on the wafer (particularly near the edge) which are dislocations caused in the crystal structure of the silicon due to unequal movement of atomic planes therein from thermally induced stresses. The slip line formation problem can be particularly severe in the high-temperature regime (e.g. $T > 900°$ C.) since the silicon yield strength decreases with increasing temperature. The end result may be a formation of electrically active defects which degrade the circuitry and will require disposal of the entire wafer due to excessive yield losses. It is imperative to prevent formation of slip dislocations in order to make RTP more compatible with the needs of semiconductor manufacturing environments.

In one attempt to compensate for the cooler edge temperatures and prevent slip dislocations, special reflector designs have been created in order to tailor the incident optical flux on the wafer such that the photon flux increases slightly towards the edge. This arrangement provides more heat to the edges of the wafer during the steady-state segment of the wafer heating cycles. However, providing more heat to the wafer edges may also cause a transient temperature overshoot near the edges with respect to the wafer center during a rapid heat-up transient which makes the edge hotter than the center, creating the same "slip" problem. Additionally, since the heat compensation is entirely dependent upon the reflector design, providing extra heat to the edge of the wafer through a special reflector is not a general solution to the temperature nonuniformity problem since it does not allow sufficient flexibility over a wide range of temperatures for both transient and steady-state conditions.

Another attempt to prevent cooler edge temperatures and minimize slip formation has been to place a silicon ring around and in contact with the edge of the wafer. The silicon ring provides extra thermal mass to retain heat on the edge of the wafer, but again does not offer sufficient flexibility over a wide range of temperatures. Thus, the need exists for a method and apparatus to provide uniform temperature control in lamp heated, single-wafer RTP systems that is flexible over a wide range of temperatures and operates based on a real-time monitoring of the wafer temperature uniformity.

SUMMARY OF THE INVENTION

The present invention disclosed herein comprises a method and apparatus for real-time wafer temperature uniformity control in a lamp heated, single-wafer rapid thermal processing (RTP) system which substantially eliminates or reduces problems associated with the conventional temperature control methods. The present invention allows uniform heating across the surface of a wafer by eliminating the radial wafer temperature gradients via a closed-loop temperature uniformity monitoring and adjusting system. This invention provides slip-free RTP operation with a real-time pocess-independent control method over a wide range of temperatures (250° C.<T<1250° C.). One assumption of the present invention is that the RTP lamp module and equipment design ensures cylindrical temperature symmetry and the only existing temperature gradients (without the implementation of the method and apparatus described in this invention) are radial. Moreover, it is further assumed that the radial temperature nonuniformities are mostly localized near the edges of the wafer where the temperature is always lower than the central region of the wafer during the rapid heat-up, steady-state, and the rapid cool-down segments of the thermal cycle. The use of the method and the apparatus of this invention eliminate the need for excess edge heating by other means such as a silicon ring or tailoring of the optical flux by special lamp reflector design.

In accordance with one aspect of the invention, the temperature of a semiconductor wafer is controlled in a single-wafer, RTP reactor having a heating lamp module. A laser is adapted along with a beam splitter to produce two laser beams of equal power, with a first laser beam optically coupled through the lamp module and the process chamber vacuum window to a near-edge point on the wafer and a second laser beam optically coupled through the lamp module and the vacuum window to a center point on the wafer. In the case of face-down wafer processing the laser beams are sent onto the unpolished wafer backside. Both the laser beams have the same angle of incidence.

The wavelength at the laser beam photons interacting with the silicon wafer is chosen such that the sensitivity of the surface optical properties being probed to the wafer temperature is large over a wide range of temperatures (250° C.$\leq$T$\leq$1250° C.). The surface reflectance and transmissivity of a semiconductor wafer depend on the real-part of the index of refraction, the extinction coefficient, and the semiconductor bulk photon absorption properties. The semiconductor physical parameter, such as its bandgap energy and free-carrier concentration depend on temperature. Therefore, the wafer surface and bulk optical properties such as the coefficients of reflection and transmission as well as the surface emmissivity are functions of temperature. In the long-wavelength infrared regime (e.g. $\lambda > 3\mu m$) the interactions between the infrared photons and free carriers are strong and the wafer surface optical properties and its bulk transmission coefficient can vary with temperature over a wide temperature range. In the extreme of shorter wavelength photons (i.e. wavelength less than one micron or the photon energy larger than the silicon bandgap energy), the interactions between the free carriers and the incident photons are minimal and the incident photons interact with the semiconductor lattice mainly through a direct band-to-band absorption mechanism. This invention employs a laser source capable of generating a coherent infrared beam of approximately 5.3 microns in wavelength in order to enhance the sensitivity of the coefficients of reflection and transmission to wafer temperature variations. However, the method and the apparatus of this invention are applicable to a wide range of wavelengths. In fact, multiple beams of laser may be wed in applications where a very extended temperature range is desired.

Two matched infrared photo-detectors are positioned to receive the laser beams after reflection from the surface of the wafer. The two matched photo-detectors produce electrical signals which correspond to the intensities of the two beams reflected from the center and the edge regions of the wafer backside. A differential amplifier evaluates the output from the first and second infrared photo-detectors, and if a difference in the output is detected, a signal is sent to a power supply controller to adjust the electrical current of a heating element. The heating element is positioned around the wafer and by responding to the variable power supply, will adjust the temperature of the wafer edge until the edge and center are at equal temperatures. If necessary, an additional pair of matched infrared photo-detectors can be used to detect and measure the intensity of the transmitted portions of the two incident laser beams outside the process chamber and on the opposite side of the wafer. A second differential amplifier compares the output signals of this additional pair of photo-detectors and the output of this differential amplifier is also fed to the power supply controller. The use of the additional pair or infrared photo-detectors for transmitted portions of the incident laser beams along with the first pair of photo-detectors for the reflected portions of the incident beams ensures reliable operation of the apparatus over an extended temperature range.

In a further aspect of the present invention, light pipes are provided to optically couple the laser beams, the wafer and the infrared photo-detectors for the reflected beams. The laser preferably comprises a carbon monoxide (CO) laser and a beam splitter to provide two infrared laser beams of equal power. When the differential amplifier detects a difference between the power of the two reflected laser beams, a nonzero signal is sent to a power supply controller which controls an adjustable current source to increase or decrease the amount of heat generated by the heating element and make the edge temperature equal to the center temperature in a feedback control loop. At lower temperatures (e.g. T$\leq$600° C.) the silicon wafer becomes at least partially transparent to the infrared laser beam and a portion of the incident laser beams transmit through the wafer. The use of an additional set of a pair of photo-detectors and a differential amplifier for the transmitted beams, provides an additional means of probing the wafer temperature gradient (besides the assembly used with the reflected signals). One output or a combination of the two outputs of the differential amplifiers can be used by the controller to adjust the heater current.

It is a technical advantage of the present invention that wafer temperature uniformity control is provided over a wide range of operating temperatures (250° C.<T<1250° C.). It is a further technical advantage that an absolute wafer temperature reading is not required and the apparatus operates based on a measurement of the temperature difference between the center and the edge regions. The differential amplifiers merely receive the photo-detector signals corresponding to the coefficients of reflection and transmission at the edge and at the center of the wafer and their output difference signals are measures of the wafer temperature gradients. It is a still further technical advantage that the present invention will prevent temperature overshoot of the wafer edge by constantly monitoring and readjusting the temperature in the edge zone of the wafer. Moreover, the apparatus and method of this invention operate properly independent of any real-time changes in the values of wafer optical absorption and transmission properties (for instance, due to the formation of thin films on the wafer backside surface during wafer processing and the corresponding variations of the wafer emissivity and reflectivity). Any changes in the surface emissivity and the bulk absorption values of the wafer affect both the reflected (and also both the transmitted) portions, of the laser beams to the same extent, therefore, the net effect on the feedback control loop is zero due to the cancellation of the effects of those changes in the differential amplifiers. In addition, any drifts in the laser output power will not affect the thermal compensation process and its accuracy. In general, any residual radial temperature gradients on the wafer are made nominally zero with the apparatus and method of this invention. The important system parameters such as its overall signal-to-noise ratio and dynamic range over the desired wafer temperature range are governed by a number of factors such as laser wavelengths, nominal wafer temperature, photo-detector noise, and the mode of operation of the apparatus (e.g. operation based on the use of one differential amplifier for the reflected beams versus two differential amplifiers for the reflected as well as transmitted laser beams). The design goal should be to reduce the maximum radial temperature gradients at all times to less than a few degrees (e.g. 2° C.) by the suggested technique.

BRIEF DESCRIPTION OF THE DRAWINGS

For a more complete understanding of the present invention and for further advantages thereof, reference is now made to the following Detailed Description taken in conjunction with the accompanying Drawings, in which.

DETAILED DESCRIPTION OF THE INVENTION

Figure 1:
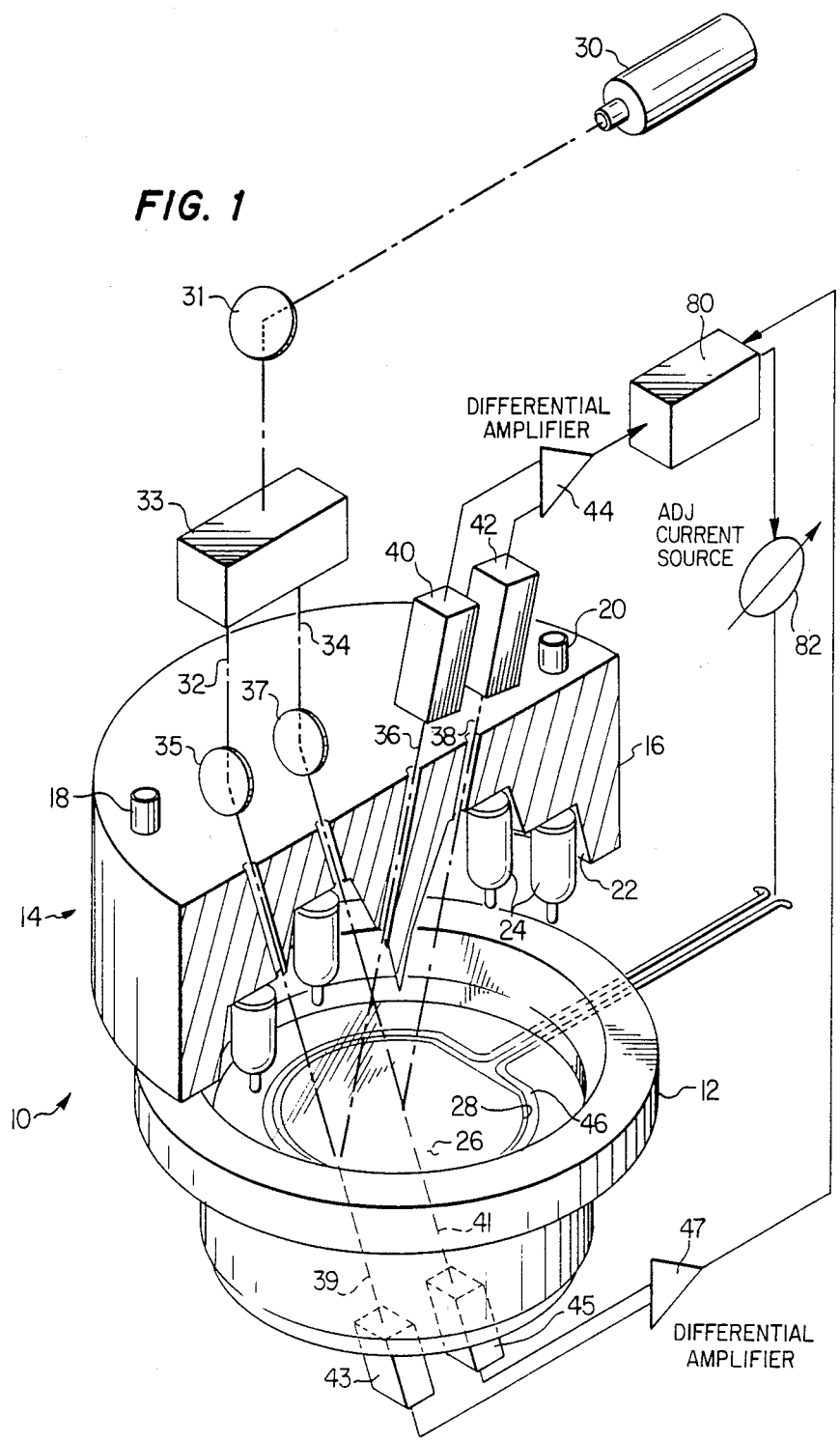
FIG. 1 is a partially cutaway perspective view of an apparatus constructed in accordance with the present invention.
Figure 2:
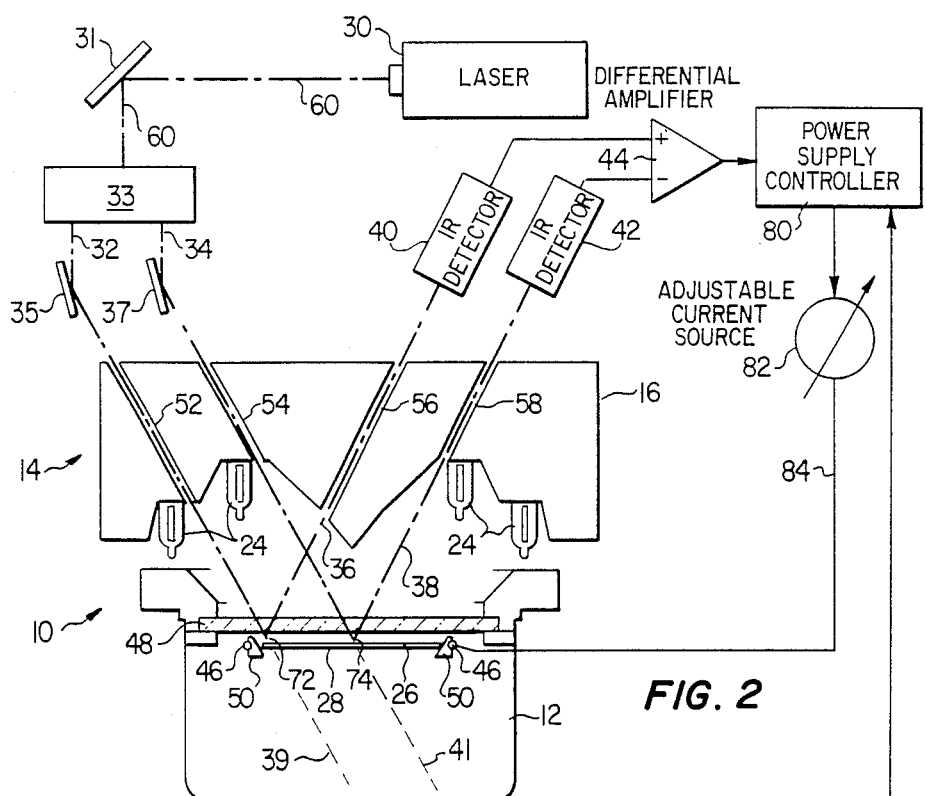
FIG. 2 is a cross-sectional view of the present invention.
Figure 3:
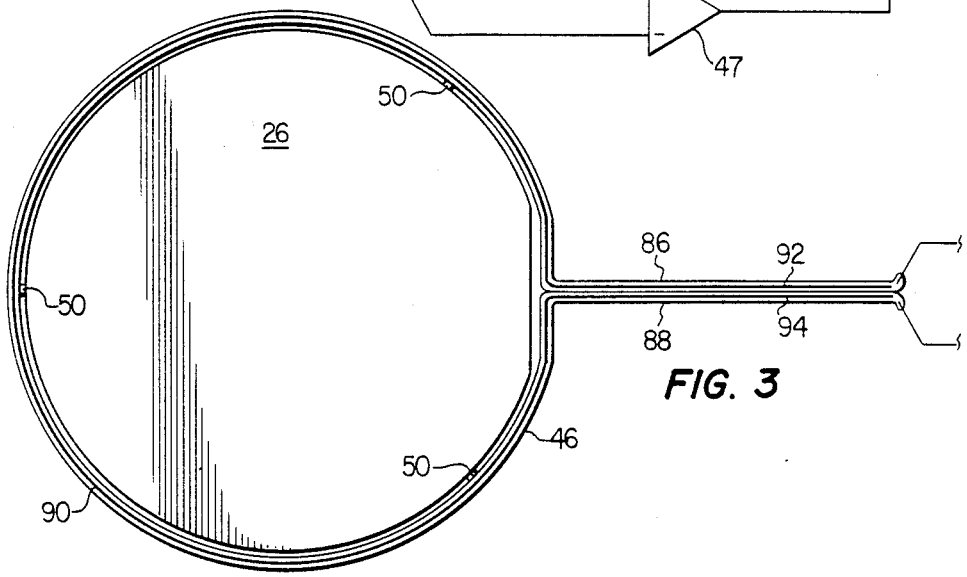
FIG. 3 is a top elevation of a heating element embedded in a wafer tray constructed in accordance with the preferred embodiment of the present invention.

In FIGS. 1 through 3, like items are identified by like and corresponding numerals for ease of reference. Referring to FIG. 1, a partially cutaway perspective view of an apparatus constructed in accordance with the preferred embodiment of the present invention is generally identified by the reference numeral 10. Apparatus 10 comprises a vacuum chamber 12 which may, for example, be a single-wafer rapid thermal processing (RTP) reactor or an Advanced Vacuum Processor (AVP).

A heating lamp module 14 provides the optical heating to process a semiconductor wafer within vacuum chamber 12. Module 14 comprises a shroud 16 for housing a cooling liquid such as water and has an inlet 18 and an outlet 20 to allow the constant flow of cooling liquid therethrough. A reflective surface 22 contains a plurality of heating lamps 24, which radiate optical energy for selective wafer heating to drive the process within chamber 12. A silicon semiconductor wafer 26 is placed within chamber 12 usually with a device side 28 facedown (unpolished backside face-up).

A laser 30 emits an infrared laser beam onto a reflector 31 and thence into a beam splitter 33 to provide first and second laser beams 32 and 34 of equal power and wavelength. Laser beams 32 and 34 strike reflectors 35 and 37 and are then directed through lamp module 14 to strike the wafer 26. Some fractions of beams 32 and 34 are then reflected by the wafer 26 through lamp module 14 as indicated by reflected laser beams 36 and 38. Reflected laser beams 36 and 38 are received by a pair of matched infrared photo-detectors 40 and 42, respectively. Detectors 40 and 42 measure the power of reflected laser beams 36 and 38 and their output electrical signals are passed to a differential amplifier 44.

Amplifier 44 evaluates the strengths of beams 36 and 38 and provides appropriate data based on the difference between the two photo-detector outputs which are fed to a power supply controller to adjust the output current of a current source to raise or lower the temperature of a quartz ring 46 surrounding wafer 26 as will be subsequently described in greater detail. Quartz ring 46 has a buried tungsten heating wire which provides heat to the edge of wafer 26 to raise the edge temperature, if needed, and to make it equal to the temperature of the center of wafer 26. Thus, apparatus 10 provides a closed-loop feedback temperature controller for a single-wafer processor that maintains a uniform temperature across the surface of a wafer in real-time over a wide range of temperatures without the risk of edge temperature overshoot. Moreover, as shown in FIG. 1, the transmitted portions 39 and 41 of the two laser beams incident on the edge and on the center of the wafer can be detected by an additional pair of matched infrared photo-detectors 43 and 45. A second differential amplifier 47 provides another control signal for the power supply controller 80 based on the difference between the two photo-detector outputs. Any discrepancy between the transmittance of the wafer at the center and at the edge (caused by radial temperature gradients) is detected by the differential amplifier as a nonzero electrical signal. The feedback control process may be performed either solely based on the differential reflectance data or based on a combination of the differential reflectance and differential transmittance data. The latter provides a wider range of operating wafer temperatures with enhanced signal-to-noise for the feedback control system.

Referring to FIG. 2, a cross-sectional view of the apparatus 10 is illustrated. Vacuum chamber 12 includes a covering window 48 which may comprise quartz or sapphire. Window 48 preferably comprises sapphire, which will allow the passage of wavelengths (approximately 0.15–5.5 microns) of infrared laser light therethrough. Additionally, sapphire has thermal and mechanical properties that are preferable to quartz. Sapphire has a thermal conductivity of approximately twenty times larger and a tensile strength of approximately eight times higher than quartz. Thus a thinner window of sapphire may be used than quartz which can minimize any interference caused by heating of the window.

The wafer 26 rests device side 28 facedown on a plurality of quartz pins 50, attached to the ring 46, to allow processing of the wafer 26. The quartz ring 46 is spaced apart a uniform distance around wafer 26 in contact with pins 50 only.

Shroud 16 of lamp module 14 has four passages 52, 54, 56 and 58 passing therethrough. Passages 52-58 may comprise hollow cylindrical metallic light pipes or optical fibers having an inside diameter of approximately 1/16 inch. Heating lamps 24 are secured within shroud 16 and may comprise tungsten-halogen or xenon-arc lamps.

The laser 30 may comprise a fixed-wavelength or tunable carbon monoxide (CO) infrared laser, a gas $CO_2$ laser or a lead-salt diode laser. A CO laser (economically the most preferable) is capable of operating with a desired wavelength of approximately 5.3–5.7 microns. If a gas $CO_2$ laser is used (wavelength=10.6 microns), a frequency doubler, for example, a nonlinear optical crystal such as silver/gallium/selenide ($AgGaSe_2$) using a second harmonic generation technique, is required to provide a laser beam having a wavelength of approximately 5.3 microns.

An infrared laser beam 60 emitted by the laser 30 is directed to the infrared mirror 31, which reflects the laser beam 60 to a beam splitter 33. The beam splitter 33 splits laser beam 60 into first laser beam 32 and second laser beam 34 of equal power and wavelength. Beam 32 then strikes infrared mirror 35 and beam 34 strikes infrared mirror 37 which reflects beams 32 and 34 at the correct angle to enter passages 52 and 54, respectively.

First laser beam 32 is aimed by passage 52 toward an edge point 72 on wafer 26 while passage 54 aims laser beam 34 at a center point 74. Wafer 26 reflects some portions of laser beams 32 and 34 to produce first reflected laser beam 36 and second reflected laser beam 38, which pass through passages 56 and 58, respectively. Reflected laser beams 36 and 38 are received by matched infrared photo-detectors 40 and 42 which send power reading data to the differential amplifier 44.

Differential amplifier 44 evaluates the data from detectors 40 and 42 for any power difference between the reflected laser beams 36 and 38. If there is no power difference, differential amplifier 44 provides a zero output signal indicating that the temperature of the center point 74 of wafer 26 is equal to the temperature of the edge point 72 of wafer 26. If there is a difference in the power reading data from detectors 40 and 42, amplifier 44 will send a signal to power supply controller 80. Power supply controller 80 then signals an adjustable current source 82 which provides current through an electrical cable 84 to the tungsten wire heater in the quartz ring 46.

Quartz ring 46 becomes hotter or cooler as a result of the current provided by the adjustable current source 82. If amplifier 44 determines that edge point 72 is cooler than center point 74, more electrical current is applied to make ring 46 hotter. Due to the proximity of ring 46 to the edge of wafer 26, heat will be transferred to the edge of wafer 26 raising the temperature thereof and eliminating the radial temperature gradients.

Thus, the apparatus 10 provides a closed-loop temperature control for the wafer 26 on a real-time basis. As the differential amplifier 44 senses a temperature gradient between the edge point 72 and the center point 74 of wafer 26, appropriate adjustments are made in real-time until the variation has been eliminated and the wafer 26 has a uniform surface temperature. The signal-to-noise performance and operating temperature range of the feedback control system can be improved by using an additional pair of infrared photo-detectors 43 and 45 to sense the transmitted portions 39 and 41 of the incident laser beams. A second differential amplifier 47 receives the output electrical readings, of the photo-detectors 43 and 45 and provides an additional signal for the power supply controller 80 based on the difference between the transmittance of the wafer at the edge and at the center (caused by radial temperature gradients).

Although not shown, it is to be understood that apparatus 10 could be operated with two beams of laser different powers. If the two incident laser beams have different intensities, a simple room-temperature calibration step will allow apparatus 10 to operate properly over a wide range of wafer temperatures. With the wafer 26 at room temperature (thereby having an even temperature throughout), the differential amplifiers 44 and 47 are adjusted until their output signals are zero indicating a proper calibration setting for the system. This initial calibration eliminates the effects of mismatches between the power level, of the incident laser beams and between the photo-detectors in each pair.

Referring to FIG. 3, a top elevation view of quartz ring 46 is illustrated. Quartz ring 46 comprises a length of cylindrical quartz having an outside diameter between 1/16 - ⅛ inch. Ring 46 is configured to approximately match the shape of semiconductor wafer 26 and is spaced apart from the wafer 26 a uniform distance therearound. When ring 46 is shaped to match a wafer, two straight portions 86 and 88 are also formed to provide structural support and to allow electrical connection through the chamber 12 to the current source 82. It is preferable to place the quartz ring 46 in contact with three or four quartz pins 50 to hold the wafer in order to prevent conductive heat loss from wafer 26 to quartz ring 46.

Sealed within quartz ring 46 is a high resistance wire 90 which connects to low resistance wires 92 and 94 in straight portions 86–88. Wires 90–94 (preferably comprising tungsten) are interconnected to the current source 82. As current is applied to wires 90–94, heat is generated by high resistance wire 90, and the quartz ring 46 acts as an adjustable heater. Due to a relatively low thermal mass of the ring 46, a rapid modulation or variation of current within the wire 90 will rapidly vary the temperature of ring 46. Thus the ring 46 may be rapidly heated to increase the temperature of the edge of wafer 26 to match the temperature of the center of wafer 26 and prevent formation of slip dislocations and process nonuniformities.

In operation, a silicon wafer 26 is placed in vacuum chamber 12 with the device side 28 facedown. A sapphire window 48 is secured above the wafer 26 and sealed in place on the top of chamber 12. The required heat is applied to wafer 26 by optical heating module 14 through optical radiation provided by the heating lamps 24. A laser 30 emits a laser beam 60, which is split into two equal powered beams 32–34 and directed onto an edge point 72 and a center point 74 of the wafer 26.

The wafer 26 reflects some fractions of the laser beams 36–38 to a matched pair of infrared photo-detectors 40–42. The photo-detectors 40–42 send an electrical signal to a differential amplifier 44, which evaluates the signals for equality. If the signals are equal, no further change is made in the output current of the power supply. However, if the signals are of different strengths, the differential amplifier 44 signals a power supply controller 80 to change the amount of current applied through an adjustable current source 82 to a quartz ring 46. The power supply controller 80 may be further assisted by an additional pair of photo-detectors 43 and 45 and another differential amplifier 47 which detect any differences between the transmittance values of the wafer at the edge and at the center.

A tungsten filament 90 within the quartz ring 46. is heated due to the current, and the heat is transferred to the edge of the wafer 26 until the edge temperature is sensed by amplifiers 44 and 47 as equal to the center temperature. By constantly comparing the reflectance and/or transmittance values and adjusting heat, the edge of the wafer 26 is maintained at approximately the same temperature as the center of the wafer 26.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. Apparatus for controlling temperature uniformity of a semiconductor wafer in a single wafer rapid thermal processing reactor having a heating lamp module comprising:
   a first laser beam reflected from an edge point on the wafer;
   a first infrared photo-detector to receive said first laser beam;
   a second laser beam reflected from a center point on the wafer;
   a second infrared photo-detector to receive said second laser beam;
   a differential amplifier to evaluate output from said first and second photo-detectors; and
   a heating element proximate the wafer, responsive to said amplifier, to control the temperature uniformity of the wafer.

2. The apparatus of claim 1, wherein said first and second laser beams are optically coupled to the wafer by light pipes passing through the lamp module.

3. The apparatus of claim 2, wherein said light pipes have a 1/16 inch inside diameter.

4. The apparatus of claim 1, further including light pipes passing through the lamp module to optically couple the wafer to said first and second photo-detectors.

5. The apparatus of claim 4, wherein said light pipes have a 1/16 inch inside diameter.

6. The apparatus of claim 1, further comprising a laser to emit said first and second laser beams.

7. The apparatus of claim 6, where said laser comprises a carbon monoxide laser.

8. The apparatus of claim 6, wherein said laser comprises a carbon dioxide laser.

9. The apparatus of claim 8, wherein said carbon dioxide laser further includes a frequency doubler.

10. The apparatus of claim 6, further including a beam splitter to form said first and second laser beams.

11. The apparatus of claim 1, further comprising:
    a power supply controller connected to said amplifier; and
    an adjustable current source connected to said power supply and said heating element to raise or lower the temperature of said heating element in response to said amplifier and said controller.

12. The apparatus of claim 1, wherein said heating element comprises:
    a quartz tube encircling the wafer; and
    a filament within said tube to generate heat responsive to said amplifier.

13. The apparatus of claim 12, wherein said filament comprises tungsten.

14. The apparatus of claim 1, further comprising a sapphire window between the lamp module and the wafer.

15. The apparatus of claim 1, further comprising:
    a third infrared photo-detector for receiving a transmitted portion of said first laser beam;
    a fourth infrared photo-detector for receiving a transmitted portion of said second laser beam; and
    a second differential amplifier to evaluate output from said third and fourth photo-detectors and to provide data to said heating element.

16. A wafer temperature controller for a silicon semiconductor wafer rapid thermal process reactor which utilizes a heating lamp module, comprising:
    a laser which produces a first and second laser beam, each said beam being of equal power and wavelength, said first beam striking an edge point on the wafer, and said second beam striking a center point on the wafer;
    a first infrared photo-detector for receiving said first laser beam reflected from the wafer;
    a second infrared photo-detector for receiving said second laser beam reflected from the wafer;
    a differential amplifier for evaluating any power variation between said reflected beams; and
    a heating element for adjusting the temperature of the wafer responsive to said amplifier such that the wafer temperature is controlled.

17. The apparatus of claim 16, wherein said laser further includes a beam splitter to produce said first and second laser beam.

18. The apparatus of claim 16, wherein said laser comprises a carbon monoxide laser.

19. The apparatus of claim 16, wherein said laser comprises a carbon dioxide gas laser.

20. The apparatus of claim 19, wherein said carbon dioxide laser futher comprises a frequency doubler.

21. The apparatus of claim 16, further comprising:
    a third infrared photo-detector for receiving a transmitted portion of said first laser beam;
    a fourth infrared photo-detector for receiving a transmitted portion of said second laser beam; and
    a second differential amplifier to evaluate output from said third and fourth photo-detectors and to provide data to said heating element.

22. A method for controlling temperature uniformity of a semiconductor wafer in a single wafer rapid thermal processing reactor having a heating lamp module, comprising the steps of:
    reflecting a first laser beam from an edge point on the wafer;
    receiving said first laser beam with a first infrared photo-detector;
    reflecting a second laser beam from a center point on the wafer;
    receiving said second laser beam with a second infrared photo-detector;
    evaluating output from said first and second photo-detectors with a differential amplifier; and
    heating an edge of the wafer with a heating element responsive to said amplifier to control the temperature uniformity of the wafer.

23. The method of claim 22, wherein the step of reflecting comprises:
    aiming at least one laser at the wafer; and
    optically coupling said laser through the lamp module with the wafer.

24. The method of claim 22, further comprising the step of calibrating said amplifier by zeroing said amplifier with the wafer at a uniform ambient temperature.

25. The method of claim 22, wherein the step of receiving further includes optically coupling the wafer to said photo-detectors with a first and second light pipe through the lamp module.

26. The method of claim 22, wherein the step of evaluating comprises measuring a power difference between said first and second reflected laser beams.

27. The method of claim 22, wherein the step of heating comprises the steps of:
generating a current from a current source; and
heating a tungsten filament within said heating element with said current.

28. A method for controlling a wafer temperature in a silicon semiconductor wafer rapid thermal process reactor which utilizes a heating lamp module, comprising the steps of:
generating a first and a second laser beam of equal power;
reflecting said first laser beam from an edge point on the wafer;
reflecting said second laser beam from a center point on the wafer;
detecting said reflected laser beams with first and second infrared photo-detectors;
evaluating said reflected laser beams for a power difference with a differential amplifier; and
heating an edge of the wafer with an element responsive to said amplifier such that the wafer temperature is controlled.

29. The method of claim 28, wherein the step of generating comprises directing a laser beam into a beam splitter.

30. The method of claim 28, wherein the step of reflecting further comprises optically coupling a laser with the wafer by light pipes through the heating module.

31. The method of claim 28, wherein the step of detecting comprises optically coupling the wafer and said photo-detectors with light pipes through the heating module.

32. The method of claim 28, wherein the step of heating an edge comprises the steps of:
generating a current from a current source based on said step of evaluating; and
heating a filament in said element with said current.

* * * * *